United States Patent [19]

Soni et al.

[11] Patent Number: 4,568,851
[45] Date of Patent: Feb. 4, 1986

[54] PIEZOELECTRIC COAXIAL CABLE HAVING A HELICAL INNER CONDUCTOR

[75] Inventors: Pravin L. Soni, Union City; Peter I. C. Turk, Hayward, both of Calif.

[73] Assignee: Raychem Corporation, Menlo Park, Calif.

[21] Appl. No.: 649,382

[22] Filed: Sep. 11, 1984

[51] Int. Cl.[4] ............................................. H01L 41/08
[52] U.S. Cl. ..................................... 310/800; 310/330; 174/131 A
[58] Field of Search ................. 310/311, 334, 336–338, 310/800, 330, 331; 174/113 C, 131 A; 367/154, 141, 157, 170

[56] References Cited

U.S. PATENT DOCUMENTS

| | | | |
|---|---|---|---|
| 53,430 | 3/1866 | Field | 174/131 A |
| 974,396 | 11/1910 | Kress | 174/131 A |
| 1,340,839 | 5/1920 | Runzel | 174/131 A |
| 3,750,127 | 7/1973 | Ayers et al. | 310/800 X |
| 3,798,474 | 3/1974 | Cassand et al. | 310/800 X |
| 4,183,010 | 1/1980 | Miller | 310/800 X |
| 4,369,391 | 1/1983 | Micheron | 310/800 |
| 4,378,721 | 4/1983 | Kaneko et al. | 310/800 X |
| 4,509,947 | 4/1985 | Lattin | 310/800 X |

FOREIGN PATENT DOCUMENTS 2042256  9/1980  United Kingdom ................ 310/800

*Primary Examiner*—Mark O. Budd
*Attorney, Agent, or Firm*—Edith A. Rice; Herbert G. Burkard

[57] ABSTRACT

A piezoelectric coaxial cable comprising a metallic helically wound inner conductor, the volume within the helix being filled with a solid material; a continuous piezoelectric polymer layer circumferentially surrounding the inner conductor; and an outer conductor in contact with the piezoelectric polymer layer but separated from the inner conductor.

6 Claims, 4 Drawing Figures

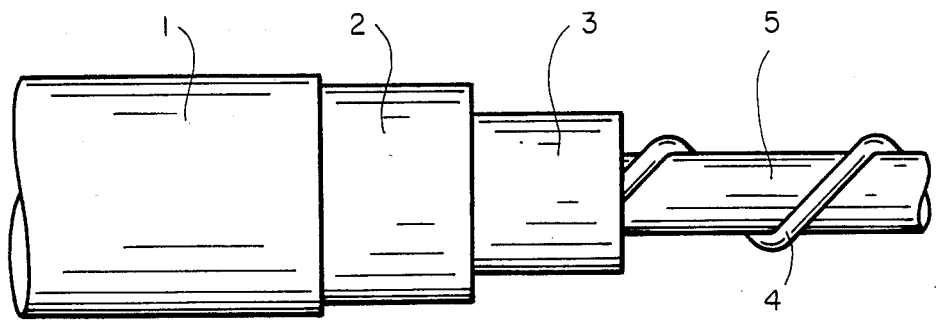
FIG_1
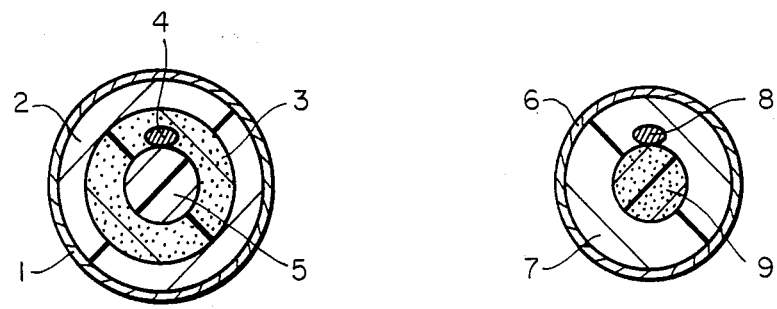
FIG_2
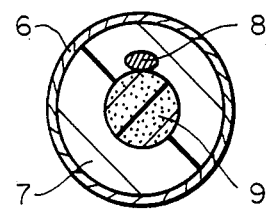
FIG_3
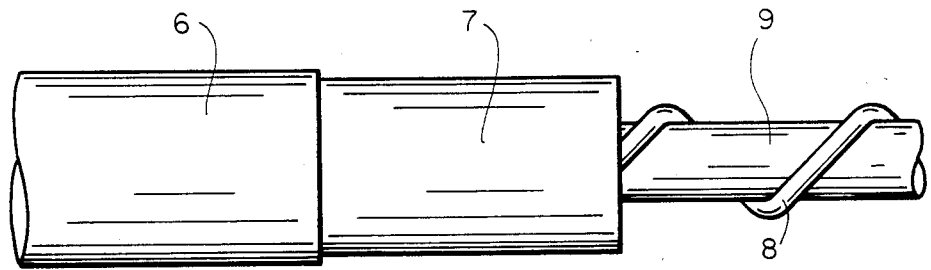
FIG_4

PIEZOELECTRIC COAXIAL CABLE HAVING A HELICAL INNER CONDUCTOR

BACKGROUND OF THE INVENTION

This invention relates to piezoelectric coaxial cables having a metallic helical inner conductor, and particularly such cables wherein the piezoelectric element comprises a vinylidene fluoride polymer, and more particularly vinylidene fluoride homopolymer. The invention further relates to a method of making such cables.

A number of piezoelectric coaxial cables have hitherto been proposed, generally comprising an inner conductor, an intermediate insulating member of piezoelectric material surrounding the inner conductor, and an outer conductor surrounding the intermediate member. Such cables have often been proposed for use as transducers since, when they are subjected to an applied pressure, for example caused by the impact of an object, or to acoustic pressure changes, a potential difference will be generated between the conductors by the piezoelectric material. Applications are numerous and include underwater hydrophones, intrusion detectors, strain transducers, and vibration sensors.

In recent years certain polymeric materials, for example poly(vinylidene fluoride) (PVF2) and poly(vinylidene fluoride) copolymers have been suggested for use as piezoelectric materials. In order to maximize the piezoelectric properties of a vinylidene fluoride polymer, it is necessary to orient the polymer by stretching it, preferably up to its "natural" draw ratio of about 4:1 or beyond, in order to convert at least a portion of the polymer from its initial alpha or form II crystalline phase into its beta or form I crystalline phase. Simultaneously with, or subsequent to, the stretching operation, it is necessary to polarize the polymer by applying a high electric field across the polymer in a direction perpendicular to the direction of orientation in order to align the dipoles of the polymer. Electric field gradients of from 5 to 200 MV/m are typical for the polarizing operation, the maximum applied field gradient usually being determined by the dielectric breakdown strength of the polymer material. The step of polarizing the polymer is frequently also referred to as "poling."

In a piezoelectric coaxial cable, in order to maximize its piezoelectric response, the intermediate piezoelectric member would need to be stretched axially and polarized radially between an inner, central electrode or conductor and an outer electrode or conductor in order to convert it from an ordinary dielectric into a piezoelectric material. While the outer electrode may be applied to the intermediate layer after stretching, or, if a corona poling method is employed, the cable may be poled first and an outer conductor for the cable subsequently provided, significant problems are encountered in the provision of the inner electrode. It is not possible to extrude the intermediate member onto a conventionally configurated metal conductor, e.g., a straight, solid copper conductor, in that it would then be impossible subsequently to stretch the intermediate layer in order to convert it into the beta-phase. This problem is particularly acute when attempting to make long lengths of piezoelectric coaxial cable.

One solution is disclosed in U.K. Pat. App. GB No. 2,055,018, to Obata et al., in which a tube of piezoelectric polymer is filled with a low melting point material, for example a low melting point metal alloy and then stretched and poled. The difficulty presented by the incompatibility of ordinary metallic inner conductors with the stretching of the piezoelectric polymer is avoided because stretching can be performed at about or above the melting point of the alloy, but still below the melting point of the piezoelectric polymer. However, such alloys are relatively brittle, especially after multiple melting recrystallization cycles, causing piezoelectric coaxial cables made with low melting point alloy cores to be susceptible to a loss of electrical continuity due to breaks in the alloy. Furthermore, during the stretching process the alloy is molten and the piezoelectric member stretches as a free tube, resulting in a tendency to produce discontinuities in the alloy which are undesirable because they cause poor electrical contact. Consequently, it is difficult to make long lengths of such coaxial cables.

Another solution is to prepare separately a tape of the piezoelectric polymer, stretch it, pole it, and then wrap it around the inner conductor. See, for example, U.S. Pat. No. 3,798,474, to Cassand et al., and U.K. Pat. App. GB No. 2,042,256, to Quilliam. However, this process is disadvantageous in that it requires extra steps and can result in poor electrical contact between the piezoelectric polymer and the inner conductor.

U.S. Pat. No. 4,303,733 to Bulle discloses filaments which are essentially coaxial cables comprising at least three layers, at least two of which are electrically conductive with at least one electrical insulating layer positioned between the two conductive layers. The patent discloses that the intermediate layer may be piezoelectric. It states that where the filament pursuant to the invention is to be provided with piezoelectric characteristics, the core component preferably is compressible, which is achieved either by utilizing hollow filaments or by selection of appropriate synthetic polymers, as for example, polyolefins with low molecular weight or polyethers. The patent continues to say that a suitable form of execution consists of using as the core component, an electrically conductive, highly viscous liquid with metal and/or carbon black and/or graphite particles dispersed therein. Suitable highly viscous liquids mentioned are, e.g., cis- and transpolyacetylene of relatively low molecular weight.

Another construction for a piezoelectric cable is disclosed in U.S. Pat. No. 3,775,737, to Laurent. In this patent the inner and outer conductors comprise spirally wound conductors. The piezoelectric sensing element comprises slotted tubular sections of piezoelectric material, intercalated with similar-shaped rubber sections. A cable according to this disclosure does not contain a continuous piezoelectric element nor is the cable amenable to a continuous fabrication process, for example extrusion.

SUMMARY OF THE INVENTION

This invention provides a piezoelectric coaxial cable comprising a metallic helically wound inner conductor, the volume within the helix being filled with a solid material; a continuous piezoelectric polymer layer circumferentially surrounding the inner conductor; and an outer conductor in contact with the piezoelectric polymer layer but separated from the inner conductor. In one preferred embodiment of this invention, the piezoelectric coaxial cable further comprises a continuous circumferential conductive polymer layer in contact with the inner conductor and the piezoelectric polymer layer but separated from the outer conductor. In another preferred embodiment, the solid material filling the volume within the helix comprises a conductive polymer. In yet another preferred embodiment, the piezoelectric coaxial cable of this invention has both continous circumferential conductive polymer layer and a conductive polymer filler for the volume within the helix.

A preferred material for the piezoelectric polymer is vinylidene fluoride polymer.

The piezoelectric coaxial cable of this invention can be made by applying a continous circumferential dielectric polymer layer over the inner conductor; stretching the inner conductor and the circumferential dielectric polymer layer; polarizing the circumferential dielectric polymer layer to render it piezoelectric; and applying an outer conductor such that it is in contact with the circumferential dielectric polymer layer but is separated from the inner conductor. Where the cable also has a continuous circumferential conductive polymer layer, it should be applied such that it is in contact with the inner conductor and the circumferential dielectric polymer layer but is separated from the outer conductor.

This invention provides a piezoelectric coaxial cable which can be manufactured continuously in long lengths, preferably by extrusion, and in which the inner conductor is compatible with the processes stretching and polarizing a dielectric polymer to render the latter piezoelectric.

BRIEF DESCRIPTION OF THE DRAWING

FIG. 1 is a side view of a piezoelectric coaxial cable of this invention, in the preferred embodiment comprising a continuous circumferential conductive polymer layer and with portions removed to reveal internal details.

FIG. 2 depicts in cross-section the cable of FIG. 1.

FIG. 3 is a cross-sectional view of another piezoelectric coaxial cable of this invention, in the preferred embodiment wherein the volume within the helical metallic inner conductor is filled with a conductive polymer.

FIG. 4 is a side view of the same coaxial cable, with portions removed to reveal internal details.

DETAILED DESCRIPTION OF THE INVENTION

This invention provides a piezoelectric coaxial cable with a metallic inner conductor, but without the aforementioned prior art limitations, thereby enabling the making of piezoelectric coaxial cables in longer lengths than heretofore achievable. It comprises a metallic helically wound inner conductor, the volume within the helix being filled with a solid material; a continous piezoelectric polymer layer circumferentially surrounding the inner conductor; and an outer conductor in contact with the piezoelectric polymer layer but separated from the inner conductor. Optionally, the piezoelectric coaxial cable further comprises a continuous circumferential conductive polymer layer in contact with the inner conductor and the piezoelectric polymer layer but separated from the outer conductor. In a preferred embodiment of this invention, the piezoelectric polymer layer comprises a vinylidene fluoride polymer.

FIG. 1 is a side view of a piezoelectric coaxial cable of this invention, in the preferred embodiment comprising a continuous circumferential conductive polymer layer, with portions removed to reveal internal details.

An outer conductor 1 is situated over a continuous circumferential piezoelectric polymer layer 2. The circumferential piezoelectric polymer layer 2 surrounds a circumferential conductive polymer layer 3, which in turn surrounds a metallic helically wound inner conductor 4. A solid material 5 fills the volume within the helix defined by the inner conductor 4. FIG. 2 depicts in cross-section the cable of FIG. 1.

FIG. 3 is a cross-sectional view of another piezoelectric coaxial cable of this invention, in the preferred embodiment wherein the volume within the helical metallic conductor is filled with a conductive polymer. An outer conductor 6 surrounds a continuous circumferential piezoelectric polymer layer 7, which in turn surrounds a metallic helically wound inner conductor 8. A conductive polymer 9 fills the volume within the helix defined by the inner conductor 8. FIG. 4 is a side view of the same coaxial cable, with portions removed to reveal internal details.

The helical configuration of the metallic inner conductor permits it to stretch along with the piezoelectric polymer, when the latter is rendered piezoelectric by stretching and polarizing. Since, as will be discussed below, the vinylidene fluoride is to be stretched by about 200 to 400%, for the inner conductor to be able to stretch accordingly the geometric relationship $$\pi d \geq 3L$$

must be satisfied, where d is the diameter of the helix and L is its pitch. Filling the void inside the inner conductor with a solid material provides support, thereby imparting further strength to the cable.

The inner conductor may be made from any metal ordinarily suitable for making wires or cables, for example, solid or stranded copper, tin or nickel plated copper, in either round or flat cross-section. The solid material inside the inner conductor may be any thermoplastic which does not degrade at the stretching temperature, which may be as high as about 170° C., although neither should it soften or melt below about 60° C. It must also stretch along with the piezoelectric polymer, which means that it must have an elongation of at least about 200 to 400 percent under the stretching conditions. The material may also be a low melting point alloy. In a preferred embodiment of this invention, the solid material comprises a conductive polymer, in this manner performing the dual functions of providing a solid support around which the inner conductor can be wound and an alternative electrical continuity path in the eventuality of any break in the inner conductor. The inner conductor provides the primary inner conductive path for the cable, so that overall the resistivity of the cable is low.

In another preferred embodiment of this invention, a conductive polymer layer is placed between the inner conductor and the piezoelectric polymer layer, such that it contacts the inner conductor and the piezoelectric polymer layer but is separated from the outer conductor. Its utility resides in providing electrical continuity in the event of any break in the inner conductor and in providing better electrical contact between the inner conductor and the piezoelectric polymer layer. It is further contemplated that in another embodiment of this invention, the piezoelectric coaxial cable comprises both an inner conductor whose inside volume is filled with a conductive polymer and a layer of conductive polymer between the inner conductor and the piezoelectric polymer.

The term conductive polymer, when used in reference to the solid material filling the volume within the inner conductor or to the optional conductive polymer layer, designates a polymeric composition which has been rendered electrically conductive by filling a polymer or polymer blend with an electrically conductive filler such as carbon black, graphite powder, metal particles such as nickel powder, and carbon, graphite, or metal fibers. Carbon black is an especially preferred filler and is preferably used in amount ranging from 5 to 50 weight percent. In addition to the aforementioned requirements for the polymeric core material, low resistivity after stretching is desirable. For conductive polymers derived from an elastomeric material, this means a resistivity of below about 500 ohm-cm after stretching 200 to 400 percent. Preferably, the conductive polymer should have a lower modulus and a higher elongation than the piezoelectric polymer.

Polymers suitable for use as conductive polymers include homopolymers and copolymers of ethylene, acrylic acid, acrylic acid esters (especially the ethyl and methyl esters), methacrylic acid, methacrylic acid esters (especially the ethyl and methyl esters), acrylonitrile, vinyl acetate, vinyl fluoride, vinyl chloride, vinylidene fluoride, vinylidene chloride, hexafluoropropylene, trifluoroethylene, chlorotrifluoroethylene, and tetrafluoroethylene. Particularly preferred among these are polymers compatible with PVDF: PVDF, poly(ethylene-co-ethyl acrylate), poly(ethylene-co-acrylic acid), elastomeric hexa-fluoropropylene copolymers such as Viton, a fluoroelastomer commercially available from Du Pont, and acrylic ester elastomers such as Vamac, also commercially available from Du Pont. By compatible, it is meant that the polymer bonds to PVDF strongly enough so that substantial interfacial contact is maintained even after a stretching process, typically at about 100° C. and for 200 to 400 percent. Fluorinated and acrylic elastomers require greater loadings of the conductive filler to become electrically conductive, but, in compensation, have greater elongation when loaded and retain their conductivity better upon stretching.

The piezoelectric polymer layer provides the cable with its ability to respond to pressure changes. It may be formed from any material that can be rendered piezoelectric by orientation and polarization. Such materials include poly(ethylene terephthalate), nylon 5, nylon 7, poly(hydroxy-butyrate), poly(acrylonitrile-co-vinyl acetate), and vinylidene fluoride polymers. The term "vinylidene fluoride polymer" is intended to include poly(vinylidene fluoride), commonly abbreviated to "PVDF" or "PVF2" and those copolymers of vinylidene fluoride which can be rendered piezoelectric by orientation and polarization. Suitable copolymers include copolymers and terpolymers of vinylidene fluoride with vinyl fluoride, trifluoroethylene, tetrafluoroethylene, vinyl chloride, and chlorotrifluoroethylene. In addition, blends of vinylidene fluoride polymers with other polymers, e.g., poly(methyl methacrylate), are included provided that the piezoelectric activity itself is not destroyed. Composites made from vinylidene fluoride polymers and filled vinylidene fluoride polymers may also be used. Preferably the piezoelectric member comprises a vinylidene fluoride polymer, more preferably poly(vinylidene fluoride) and especially it consists substantially solely of poly(vinylidene fluoride).

In this specification, where a polymer is said to be rendered piezoelectric by stretching and polarizing it, it is not meant that the polymer is perforce devoid of any piezoelectric activity without the completion of both steps, but that piezoelectric activity, if absent before completion, is generated in it or, if present before completion, is substantially enhanced in it by the performance of these steps. Furthermore, in this specification where a polymer is referred to as a "piezoelectric polymer" before it has been stretched and polarized, it is to be understood that it means a polymer which will be piezoelectric after stretching and poling, and not that it is already piezoelectric at the moment of the reference.

Possible configurations and materials for the outer conductor are diverse, subject to the requirements that it establishes and maintains good electrical contact with the piezoelectric polymer and that it is not susceptible to breaks interrupting its electrical continuity. Conductive polymer outer conductors, despite their higher resistivity, are sometimes desirable because they are easy to apply, for example, by extrusion or coextrusion. For certain applications they may even be the conductor of choice. Generally, metallic outer conductors are preferred because of their low resistivity. Preferably the metallic conductor is applied directly to the surface of the piezoelectric polymer by, for example, coating it with a conductive paint. Conductive paints comprising a suspension of metal particles, in particular silver particles, dispersed in a liquid vehicle can be employed. The paint can be applied by spraying, brushing, dipping, coating, or the like. Another technique for attaching the outer conductor is to vacuum deposit a layer of highly conductive metal, e.g. silver, onto the surface.

Optionally, a piezoelectric coaxial cable of this invention may be protected by an outer insulating jacket which may be made from any material which is a good electrical insulator and which provides the desired degree of mechanical protection. For example, polyethylene, vulcanized rubber, or poly(vinyl chloride) are commonly used. Poly(vinyl chloride) is particularly preferred.

In another aspect of this invention, additional layers of the piezoelectric member, separated from each other by a helically wound metallic conductor and a conductive polymer layer may be added, thereby increasing the piezoelectric response.

As used herein, the term "coaxial cable" is not intended to imply that the inner and outer conductors must be exactly concentric. Indeed, the inner conductor is specified to be helically situated. Rather it is intended to mean that the inner conductor is surrounded by, and insulated from, the outer conductor by the piezoelectric polymer layer and that the polymeric core and the piezoelectric polymer layer are disposed roughly concentrically with respect to each other. It will be appreciated by those skilled in the art that some deviation from absolute concentricity is the rule in coaxial cables, and in some cases this may be intended.

Where the piezoelectric polymer is PVDF, it should be stretched and polarized in a strong electric field before significant piezoelectric responsiveness develops. Stretching partially or substantially converts PVDF from the alpha-phase in which it ordinarily crystallizes from the melt into oriented chains of the more highly polar beta-phase. The stretching temperature is important. The temperature should be high enough so that there is sufficient molecular mobility for individual polymer segments to realign themselves without fracture, but not so high (above about 150° C.) so that entire alpha-phase chains are mobile enough to slide past each other instead of stretching to the beta-phase conformation, thus resulting in little conversion, and is preferably between about 60° to 110° C. The amount of stretching should be about 200 to 400 percent.

PVDF with high beta-phase content may also be prepared by crosslinking, for example by gamma or electron beam irradiation, and stretching at a temperature above its melting point by the method described in application Ser. No. 603,535 of Soni et al., the disclosure of which is incorporated herein by reference.

The poling process converts the randomly oriented dipoles of the beta-phase into uniformly oriented ones. For poling PVDF, electric fields of 5 to 200 MV/m can be used, but fields of 50 to 150 MV/m are preferred, and about 100 MV/m most preferred. The poling may be done by a contact method, in which case the outer conductor should be provided before the poling. A high voltage connection is made directly to the outer conductor while the inner conductor is connected to the ground, or vice versa. The device is heated to a temperature above the alpha-transition temperature in order to maximize molecular mobility and poled at temperature for about 0.5 to 2.5 hrs, and preferably 1 hr. A poling temperature in the range from about 60° to 85° C. is preferred and about 80° C. most preferred. At the end of this period, the device is cooled while maintaining the voltage in order to freeze in the dipole orientation.

PVDF can also be poled by a corona discharge, in which case the outer conductor must be provided after the poling. The device is passed through a tubular corona discharge electrode with the inner conductor of the device grounded. Preferred poling times are from a few minutes to half an hour. While corona poling may be performed at temperatures other than room temperature, it is often done at room temperature because temperature control is sometimes inconvenient.

While in this specification we have primarily described the process of rendering PVDF piezoelectric as "stretching and poling," this phrase does not mean that it is essential for the stretching operation be completed prior to poling, but merely that this is a common and convenient sequence in the production of the device of this invention. In fact, stretching and poling may be performed simultaneously without any adverse effects on the piezoelectric properties thus generated or enhanced and, where the circumstances are appropriate, may even be preferable because of a reduction in the number of manufacturing steps required. Simultaneous stretching and poling can be accomplished, for example, by passing the cable between electrically charged calendar rolls or through a circular or cylindrical corona discharge electrode while being stretched.

The coaxial cable of this invention can be manufactured, for example, by multiple extrusion steps. A polymer core is first extruded. Over it is wrapped a metallic conductor in a helical manner, using a tape wrapping apparatus. Optionally, a circumferential conductive polymer layer is then extruded over the conductor, in order to provide a good conductive path and a smooth interface between the conductor and the piezoelectric polymer. Next, the piezoelectric polymer is extruded over the construction.

This process can be modified to reduce the number of steps through the use of coextrusion. For example, after the conductor has been helically wrapped around a core as described above, the conductive and piezoelectric polymer layers can be coextruded over it simultaneously.

The hydrostatic coefficient d3h is a convenient measure for estimating the piezoelectric activity of a sample of the cable of this invention. This coefficient is typically measured by placing the sample in a cyclical pressure cell, with the cyclical hydrostatic pressure being applied by a piston displacing a dielectric oil. Typical peak-to-peak pressures used during an experiment are approximately 140–1000 kPa (20–140 psi) with a frequency of 3 to 10 Hz. The pressure is measured via a Sensotec A205 transducer and 540D amplifier (accuracy approximately 9 kPa). Signals from both devices are fed into a Nicolet 2090 III digital oscilloscope from which peak-to-peak pressures $\Delta P$ and charge $\Delta Q$ can readily be determined. The hydrostatic coefficient d3h can then be determined as $$d3h = \Delta Q / A \Delta P$$

where A is the sample surface area. For a coaxial cable construction, A is given by $$A = 2\pi e e_o \, lt / \ln(R/R')$$

where e is the relative permittivity, $e_o$ is the permittivity in free space, l is the length, t is the thickness, R is the outer radius, and R' is the inner radius. A common unit for d3h is pC/N (picoCoulombs/Newton). The pyroelectric effect produced in such an experiment is not corrected for, as it amounts to only about 5% of the measured activities. Such a correction, if made, would result in an increase of the reported d3h.

The following example is provided by way of illustration and not of limitation.

EXAMPLE 1

A conductive polymer core comprising a fluoroelastomer (5 wt. %, Viton A-35, Du Pont), carbon black (10 wt. %, Raven 8000, Columbian Chemical), calcium carbonate (3 wt. %, OMYA-BSH, Omya Inc.), a phenolic antioxidant (1 wt. %), and PVDF (80 wt. %, Kynar 460, Pennwalt) was extruded. Over it was wrapped, using a tape wrapping apparatus, tinned copper flat conductor (1 mil thick, 15 mils wide) at a helix pitch of 0.05 in. Next a layer of conductive polymer comprising an acrylic elastomer (82.5 wt. %, Vamac B124, Du Pont) and carbon black (17.5 wt. %, Black Pearls 2000, Cabot) and a layer of PVDF (Solef 1008, Solvay) were coextruded over the conductor and the core, with the conductive polymer layer on the inside. The dimensions after extrusion were: core, 0.070 mil od; conductive polymer layer, 0.95 mil od; PVDF layer, 0.135 mil od. The cable was stretched to 200 to 400 percent elongation at 2 in/min at 110° C. in an Instron mechanical tester equipped with a high temperature box. An outer conductor was provided by painting on a coating of conductive colloidal silver paint. The cable was then polarized at 80° C. for 30 min in a field of 70 MV/m. The cable had a piezoelectric activity of 5.5 pC/N after polarization.

While the invention has been described herein in accordance with certain preferred embodiments thereof, many modifications and changes will be apparent to those skilled in the art. Accordingly it is intended by the appended claims to cover all such modifications and changes as fall within the true spirit and scope of the invention.

We claim:

1. A piezoelectric coaxial cable comprising
   (a) a metallic helically wound inner conductor, the volume within the helix being filled with a solid material;
   (b) a continuous piezoelectric polymer layer circumferentially surrounding the inner conductor; and
   (c) an outer conductor in contact with the piezoelectric polymer layer but separated from the inner conductor.

2. A piezoelectric coaxial cable according to claim 1 further comprising a continuous circumferential conductive polymer layer in contact with the inner conductor and the piezoelectric polymer layer but separated from the outer conductor.

3. A piezoelectric coaxial cable according to claim 1 or claim 2 wherein the piezoelectric polymer layer comprises a vinylidene fluoride polymer.

4. A piezoelectric coaxial cable according to claim 1 or claim 2 wherein the piezoelectric polymer layer comprises vinylidene fluoride homopolymer.

5. A piezoelectric coaxial cable according to claim 1 or claim 2 wherein the volume within the helix is filled with a conductive polymer.

6. A piezoelectric coaxial cable according to claim 1 or claim 2 further comprising an electrically insulating jacket over the outer conductor.

* * * * *